US006108194A

United States Patent [19]
Seligman et al.

[11] Patent Number: 6,108,194
[45] Date of Patent: Aug. 22, 2000

[54] ELECTRONICS CASE AND STAND STABILIZING WEIGHT

[75] Inventors: Marvin Seligman, Teaneck, N.J.; Chi Yu, Brooklyn, N.Y.

[73] Assignee: Lowel-Light Manufacturing, Inc., Brooklyn, N.Y.

[21] Appl. No.: 09/265,785

[22] Filed: Mar. 10, 1999

[51] Int. Cl.[7] .................................................. H02B 1/00
[52] U.S. Cl. .......................... 361/600; 361/679; 361/735; 361/736; 361/720; 361/728; 361/729; 174/17 R; 174/50; 174/50.52; 174/52.1
[58] Field of Search .................................. 361/600, 679, 361/728, 729, 735, 736, 823, 720; 174/17 R, 17.05, 17.08, 17.06, 52.1, 52.3, 54, 58, 50.51, 50.52, 50

[56] References Cited

U.S. PATENT DOCUMENTS

| | | | |
|---|---|---|---|
| 3,963,968 | 6/1976 | Pierini et al. | 361/156 |
| 4,136,962 | 1/1979 | Brouwer et al. | 356/248 |
| 4,183,667 | 1/1980 | Denton | 356/250 |
| 5,077,569 | 12/1991 | Notagashira et al. | 396/71 |
| 5,315,232 | 5/1994 | Stewart | 324/72 |

FOREIGN PATENT DOCUMENTS

10-285442  10/1998  Japan .

*Primary Examiner*—Leo P. Picard
*Assistant Examiner*—Boris L. Chervinsky
*Attorney, Agent, or Firm*—Notaro & Michalos P.C.

[57] ABSTRACT

An electronics casing is formed from interlocking upper, lower and side panels and a pair of end plates. Grooves are formed in the outer surface of the lower panel for mounting the casing on the legs or struts of tripods or other lighting supports. The weight of the casing helps counter-balance lighting elements supported on the tripod and holds the casing in place. Multiple casings may be connected together using dovetail tongue and groove connectors on the sides of the casing.

15 Claims, 8 Drawing Sheets

FIG. 11

ELECTRONICS CASE AND STAND STABILIZING WEIGHT

FIELD AND BACKGROUND OF THE INVENTION

The present invention relates generally to the field of electronic circuit casings and in particular to a new and useful case for electronic components, especially for use in lighting controls, which is attachable to a stand or tripod legs and support members to act as a weight to stabilize the stand.

Casings for electronics are well known in the art. It is desirable to protect electronic circuits from outside hazards such as water or physical contact and to prevent damage to the electronics. Casings can also be used to hold several electronic components together in a single convenient package. The case may also function to shield the circuit from EM (electromagnetic) noise and as an EM shield against noise from the circuit.

Problems associated with most casings include heat dissipation, since the electronics inside generate heat during operation. Some electronics require fans or other active heat dissipation mechanisms to prevent damage due to overheating. Positioning of casings is also problematic. Often, the electronics in the casing must be connected to other input or output elements, such as lights, speakers and microphones, or to additional circuits.

Solutions to these problems are disclosed in the prior art, including a circuit housing shown in U.S. Pat. No. 4,975,629. The circuit casing has a channel adapted for fitting over a stage lighting pipe support, such as used on theater stage flys. The casings are retained on the pipes by clamps and/or magnets. The casings disclosed include heat dissipation fins and rely on miniature cooling fans as well. This casing may be manufactured from extruded aluminum.

U.S. Pat. No. 4,763,225 discloses a heat dissipating circuit casing having a plurality of fins forming grooves arranged parallel to each other and perpendicular to the housing surface. A solid state dimmer circuit casing having a plurality of heat dissipation fins is disclosed by U.S. Pat. No. 4,972,125. The casing uses passive air cooling to cool the electronics inside. The housing is preferably made of LEXAN and RYNITE (both trademarks) materials.

Lighting support stands or tripods have been used for many years in cinematic, theatrical and photographic environments to hold lights, etc. Control circuits for the lights must be connected to each light and to a central controller. Usually the connections are made with wires or cables, which vary in length.

Stands and tripods for carrying lighting elements, such as lamps, reflectors and the like, are often top heavy due to the attached lighting equipment. As a result, it is common to use weights to counterbalance the weight of the lighting element and stabilize the stand. Sandbags are placed over lower support members of the stands, or around tripod or stand legs to help balance and keep them standing straight. For example, U.S. Pat. No. 5,520,364 discloses a weight, such as a sandbag, having a clip connector for detachably securing the weight to a variety of objects.

Other counterweight mechanisms include the light stand disclosed in U.S. Pat. No. 5,448,464, which has a counterweight slidably disposed inside the vertical member of the stand which lowers when the light is raised, so as to offset the raised weight of the light in the working position. A camera stand with a counter-weighted boom is described in U.S. Pat. No. 4,849,778, and an umbrella stand having a weighted base is taught in U.S. Pat. No. 5,354,031.

Each of these prior solutions uses an additional weight element which is otherwise non-functional to counterbalance the weight supported by the stand.

SUMMARY OF THE INVENTION

It is an object of the present invention to provide an electronic circuit casing which is easily and rapidly attachable to a stand or other tripod so that the weight of the casing will stabilize the stand.

Another object of the invention is to provide a circuit casing which helps counterbalance the weight of a lighting or other element on a stand or tripod.

A further object of the invention provides a casing having grooves or slots which simultaneously act as cooling fins and as engagement means to the stand.

It is yet another object of the invention to provide a casing which is simple to assemble and economic to manufacture.

The case may also include threaded holes at the bottom or other attachment means to attach the cases to each other or to other structures.

Accordingly, an electronic circuit casing is provided which has passive heat dissipation and can be mounted as a weight ballast on light stands. The circuit casing may be mounted on a cross-member or leg of a tripod or other low weight stand for lighting or other equipment to help offset the elevated weight of the equipment and prevent the tripod or stand from being top-heavy. For this purpose, the casing has a series of longitudinal grooves in the exterior surface for mounting at different angles on cross-members of commonly used stands. Several grooves are formed perpendicular and at angles of between about 45° and 75° to the housing surface. The grooves of the casing may be fit over the cross-member or leg of the tripod.

The casing is formed by upper and lower panels interconnected with a pair of side panels of extruded aluminum and held together by two end plates connected to the upper and lower panels by threaded connectors. The side panels are identically shaped and interchangeable. The lower panel has the longitudinal grooves on the bottom of its outer surface.

The portions of the stand forming the grooves also act as heat dissipation fins and increase the heat transfer surface area of the casing. With a metal stand strut engaged in a groove of the case, additional heat transfer takes place to the stand as well.

Two or more of the casings may be connected together using complimentary tongue and groove connectors on the sides of the casing. Connectors may be located on the sides of the lower panel. A key stone tongue is positioned on one side, and a corresponding groove is on the other side. The tongue and groove extend along the sides of the panel. The tongue of one casing can slide into the groove of a second casing so that they may be connected in a side-by-side relation.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
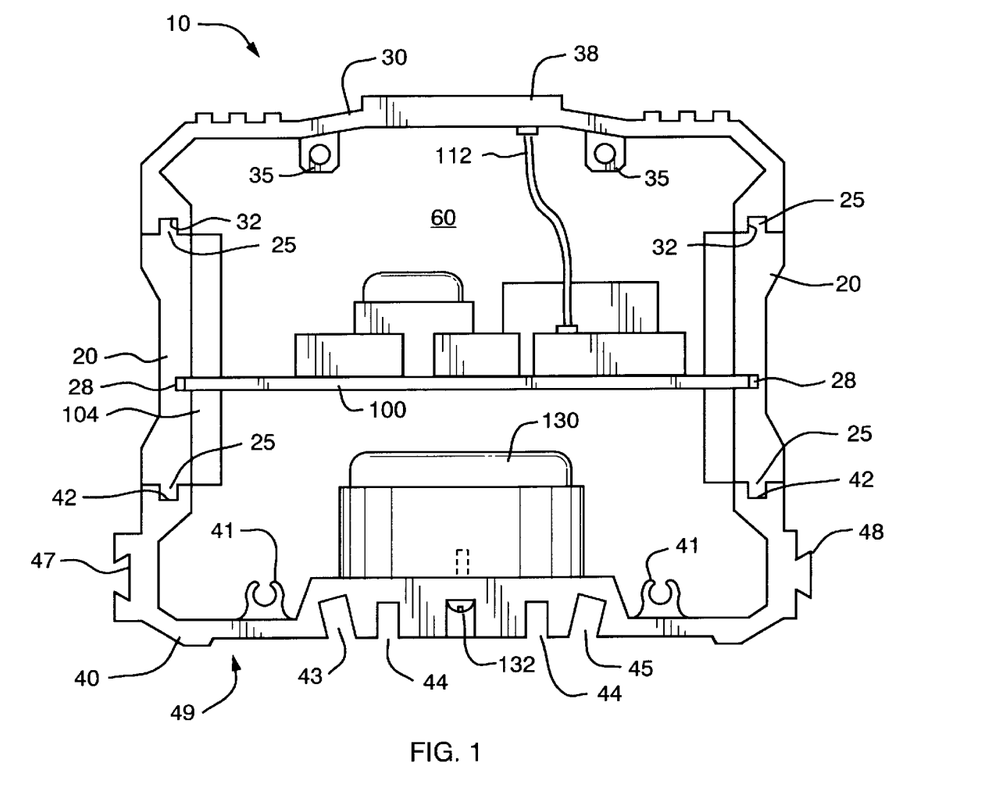
FIG. 1 is an end elevational view of the casing without its end plate.

Referring now to the drawings, in which like reference numerals are used to refer to the same or similar elements, FIG. 1 shows a casing 10 formed by two side panels 20, upper panel 30 and lower panel 40. The panels 20, 30, 40 are interconnected by grooves 32, 42 in the upper and lower panels 30, 40, respectively and complimentary ridges 25 on the side panels 20. Side panels 20 are preferably identical, so that they are interchangeable and a single manufacturing die or mold can be used to make a side panel 20 for either side of the casing 10, for example, of extruded aluminum.

The panels 20, 30, 40 form a housing volume 60 for holding electronics, such as lighting control circuits. A notch 28 can be provided on an inner surface of each of the side panels 20 for supporting an electronic component, such as a circuit board 100. The notch 28 extends along the length of the side panel 20. The side panels 20 may be made of varying heights so that the size of the housing 60 can easily be changed to accept larger or smaller electronic components.

The lower panel 40 has a series of grooves or slots 43, 44, 45 in its bottom surface 49. The grooves 43–45 are all parallel to each other and extend the length of the lower panel 40. Grooves 43 and 45 are oriented at oblique angles to the bottom surface 49 of the casing 10. Grooves 43 and 45 are preferably oriented at angles of between 45° and 80° to the bottom surface 49. The grooves 43 and 45 do not have to both be oriented at the same angle. Groove 44 is preferably perpendicular to the bottom surface 49.

Figure 4:
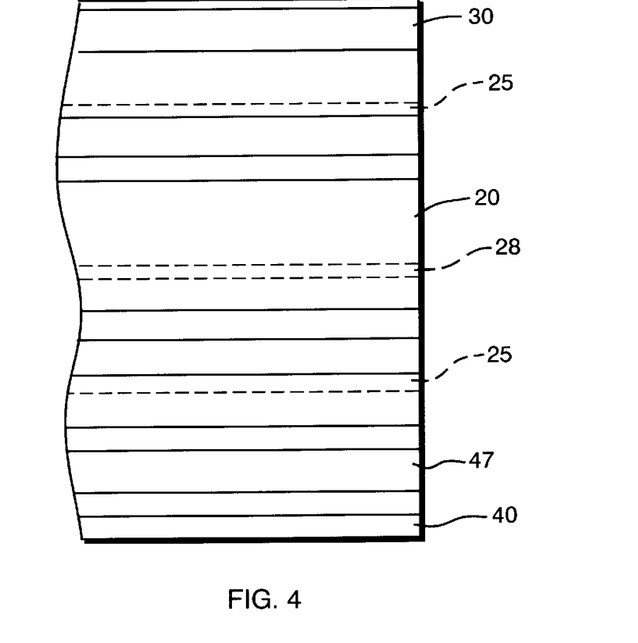
FIG. 4 is a left side elevational view of the casing.

Tongue 48 and dovetail groove 47 connectors are located on opposite sides of the lower panel 40. The tongue 48 and dovetail groove 47 connectors are used to mechanically attach additional casings 10 to each other in a side-by-side relationship. The tongue 48 and dovetail groove 47 each extend along the sides of the lower panel 40 along the length of the casing. This feature can best be seen in FIGS. 2 and 4.

It is also envisioned that the tongue 48 and dovetail groove 47 could be placed on the side panels 20 or the sides of the upper panel 30. When the tongue 47 and dovetail groove 48 are located on the side panels 20, it is especially advantageous to have both a tongue 48 and dovetail groove 47 on each side panel 20, so that a single mold can still be used to form both side panels 20. Having both connectors 47, 48 on each side panel also provides a more secure connection for additional casings 10 to the first casing 10.

Returning to FIG. 1, screw slots or channels 35 and 41 are provided along each of the upper and lower panels 30, 40, respectively. The screw slots or channels 35, 41 are recessed from the edges of the panels 30, 40 into the housing interior 60 at indent surface or step 102 shown in FIG. 10.

Figure 10:
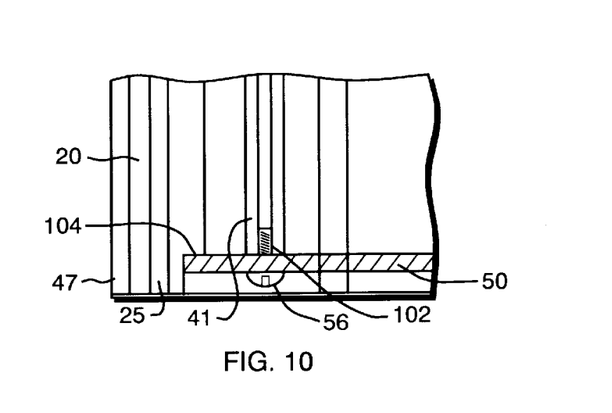
FIG. 10 is a partial, interior view of the casing near a corner thereof.

The ends of each panel 20 are also cut away to leave a step surface 104 at inner sides of each panel 20. Surfaces 102 and 104 are coplanar and act as a step to fix the recessed location of an end panel 50 which closes each end of the casing interior 60.

The panels 20, 30, 40 are held in the interconnected relationship by a pair of these end plates 50 (shown in FIG. 2) connected to each end of the housing 10. The end plates are connected by threaded connectors or screws 56 to screw slots, holes or channels 35, 41. The recessed screw slots 35, 41 and steps 104 allow the end plates 50 to also be slightly recessed or flush with the outer edges of the panels 20, 30, 40. Surfaces or steps 102 and 104 also firmly seat the end plates 50 and prevent them from bending.

Figure 2:
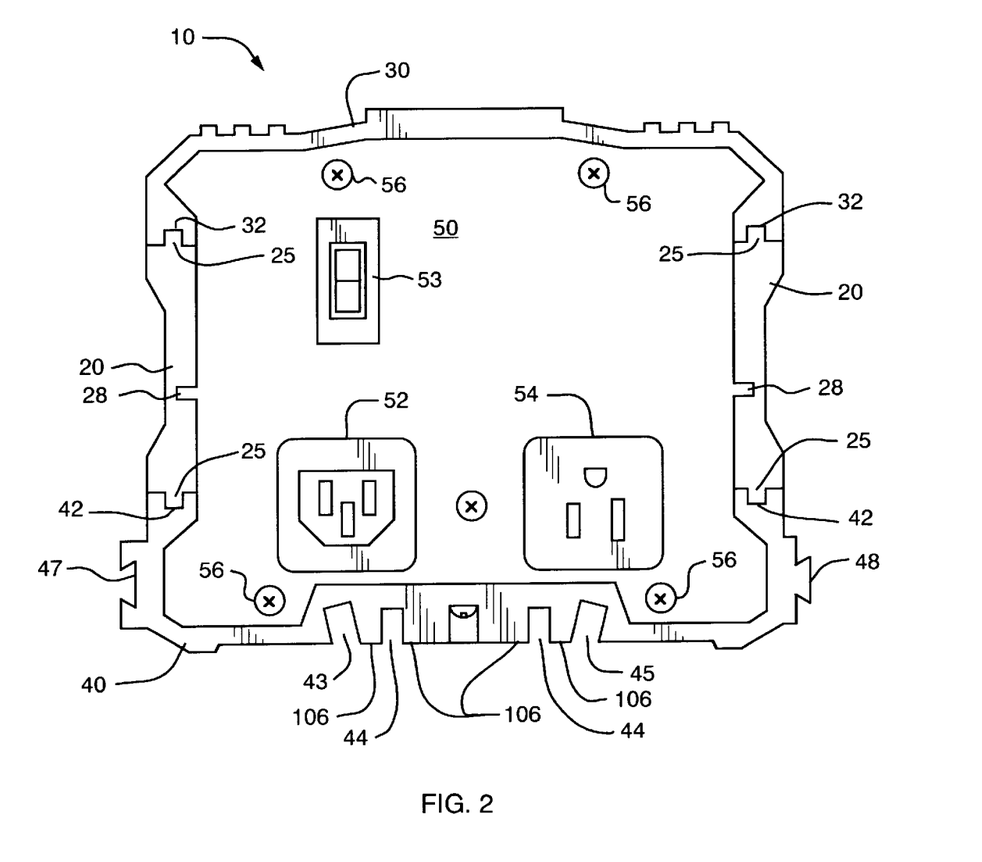
FIG. 2 is an end elevation view of the casing of FIG. 1 with the end plate.

As seen in FIG. 2, the end plates 50 may have openings for electrical connections, such as male plug connector 54, female plug connector 52 and openings for components like fuses, reset switches and the like at 53. Threaded connectors 56 attach the end plate 50 to the upper and lower panels 30, 40 and prevent the casing from coming apart. The end plates 50 close the housing volume 60 formed by the panels 20, 30, 40.

Figure 3:
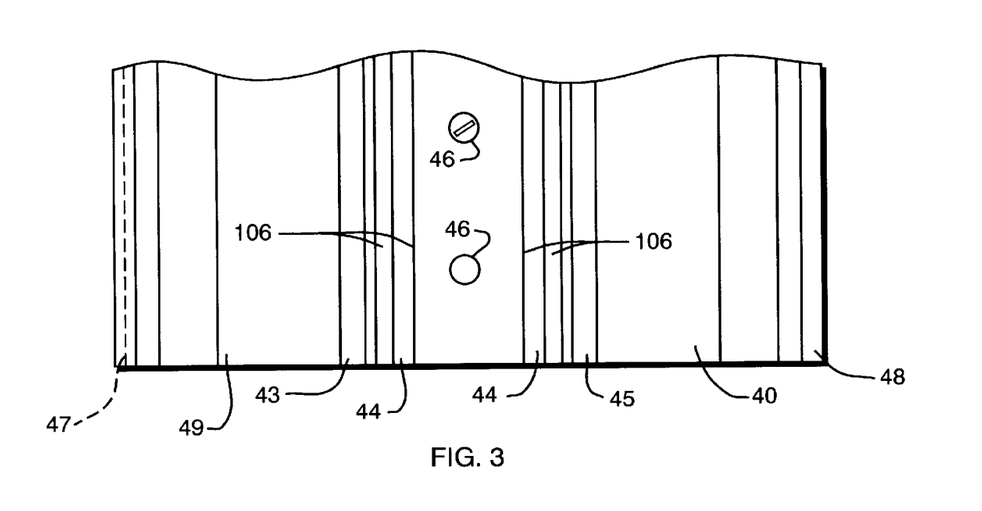
FIG. 3 is a partial bottom plan view of the casing.
Figure 11:
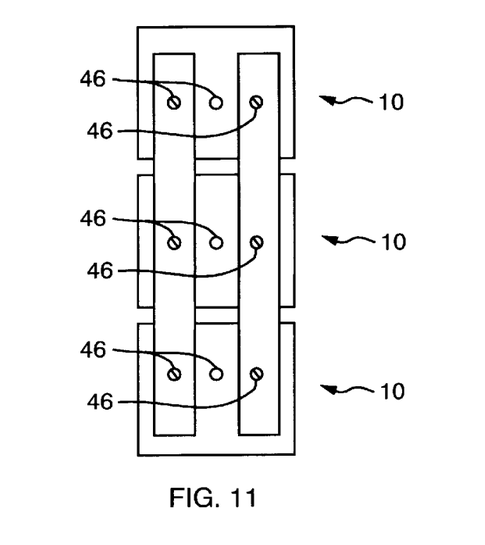
FIG. 11 is a bottom view showing how holes at the bottom of the cases can be used to connect multiple cases together.

FIG. 3 shows the parallel grooves or slots 43–45 in the bottom surface 49 extending along the length of the lower panel 40. The grooves 43, 44, and 45 are preferably of different widths to accommodate several different types of tripod or light stand cross-members or struts and legs. Angled grooves 43, 45 are between about 0.15 inches to 0.30 inches wide, and preferably either 0.20 inches or 0.26 inches to fit the legs and struts of known tripod legs, such as the OMNI and VIP stands made by Lowel-Light Manufacturing, Inc. Grooves 44 are spaced apart and oriented perpendicular to the bottom surface 49 so that the casing 10 may be mounted over parallel struts of a stand. The grooves 44 are preferably between 0.10 and 0.20 inches wide and spaced about 0.80 to 1.0 inches apart. Holes 46 at the bottom center area of the panel 40 are used to connect the case to a clamp or other support, or to a plate 146 shown in FIG. 11 by screws screwed into the threaded holes 46. The spacing and widths of each of the grooves 43–45 may be different to fit particular models or types of stands. The raised ribs 106 between the grooves also act as cooling fins for casing 10.

Figure 5:
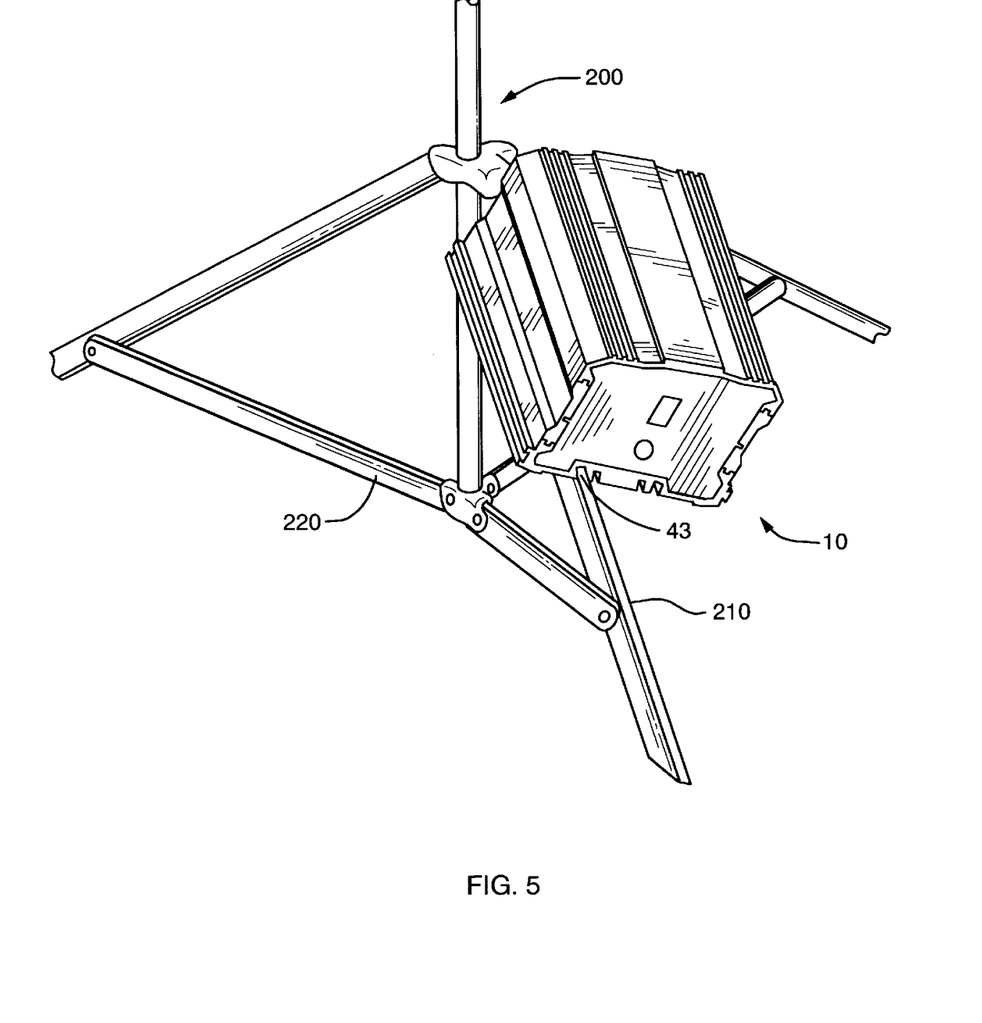
FIG. 5 is a perspective view of the casing mounted on the leg of a stand.
Figure 6:
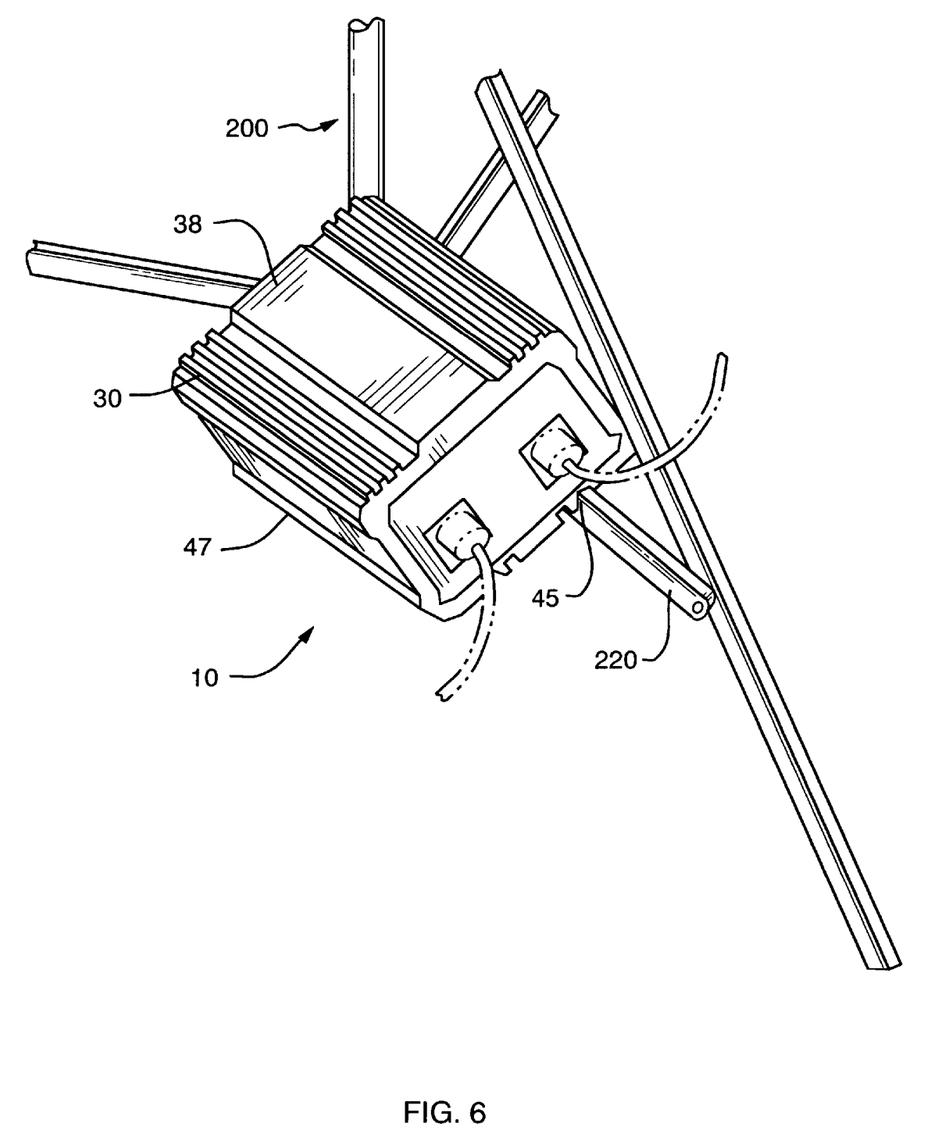
FIG. 6 is a perspective view of the casing mounted on a cross member of a stand.

FIGS. 5 and 6 show how the casing 10 can be mounted on a tripod 200 having legs 210 and struts 220 in the form of rectangular blades.

In FIG. 5, the casing 10 is mounted on the leg 210 using groove 43. The weight of the casing 10 and angle of the groove 43 cause the casing 10 to remain in place on the leg 210, as the sides of the groove 43 are pressed against the leg 210 and the off-center weight of casing 10 hangs to one side to provide a friction resistance.

FIG. 6 shows the casing 10 mounted on cross-member 220 using angled groove 45. The angle of groove 45 causes the casing 10 to also be oriented at an oblique angle relative to the ground the tripod or stand 200 is resting on. The top panel 30 of the casing has a control panel area 38 connected to the electronics inside the casing 10. The control panel 38 is used to operate the electronics inside the casing 10. When the casing houses electronics and has the control panel 38, the angled groove 45 allows the control panel 38 to also be angled when the casing 10 is mounted on the tripod 200. The angled orientation is beneficial for operating the control panel 38.

Figure 7:
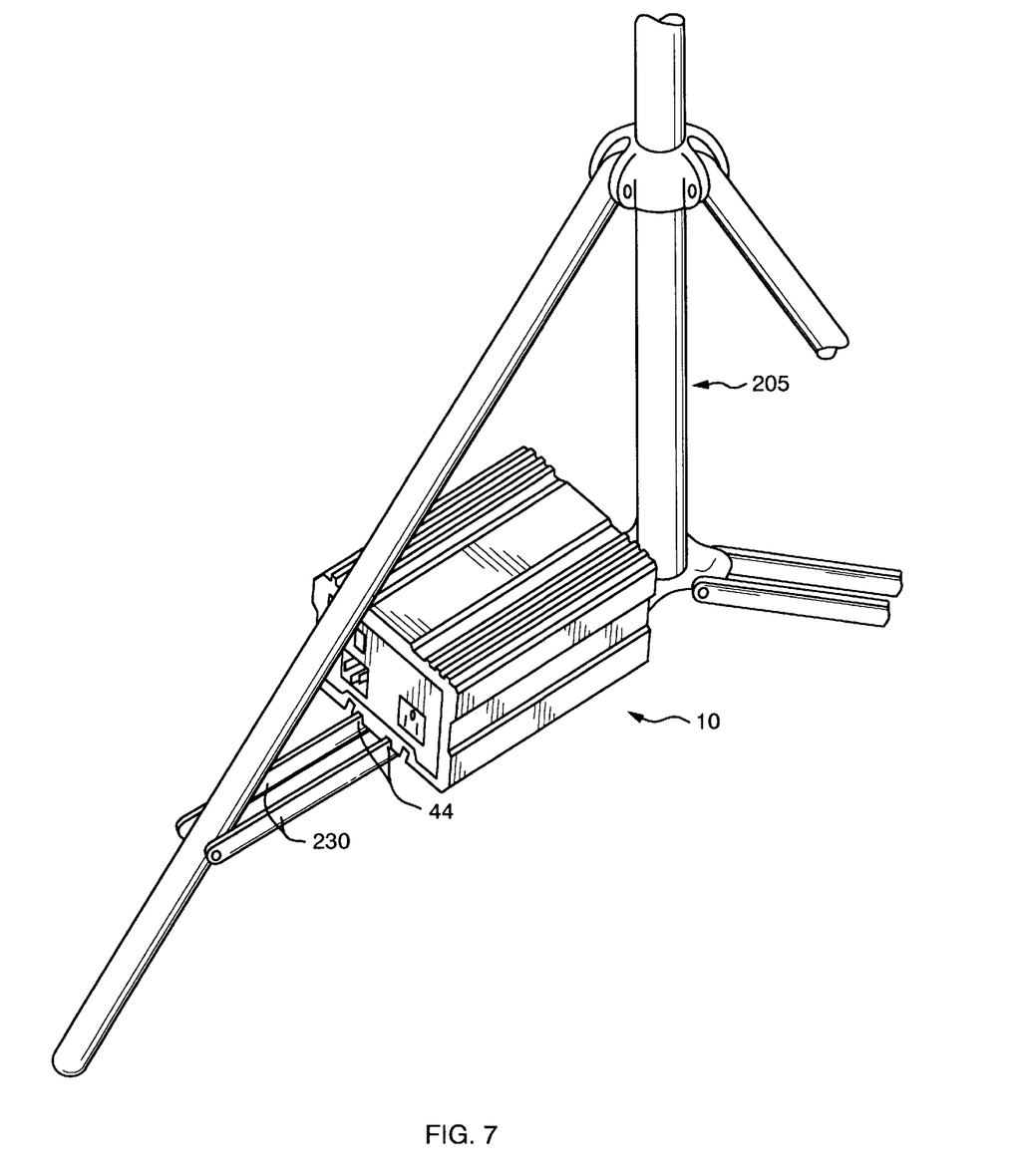
FIG. 7 is a perspective view of casing mounted on the cross member of another style of stand or tripod.

As seen in FIG. 7 grooves 44,44 are spaced apart to fit over parallel cross-members 230 of a different type of tripod or stand 205, such as a KS stand, also available from Lowel-Light Manufacturing, Inc. Each of the grooves 44 fits over one of the cross-members 230 to support and balance the casing 10.

The casing 10 has several advantages over known casings, including the ease of manufacture and assembly of the panels 20, 30, 40. The panels may each be extruded from a material, such as aluminum, to any length and then cut to size. The side panels 20 may be varied in height to easily make larger casings 10 without changing the upper and lower panels 30, 40. The interlocking nature of the side panels 20 with the upper and lower panels 30, 40 held simply by the four threaded connectors 56 through each end plate 50 permit rapid assembly and disassembly of the casing 10 as well. Recessed surfaces 102 and 104 allow the end panels also to be recessed and thus protected.

Figure 8:
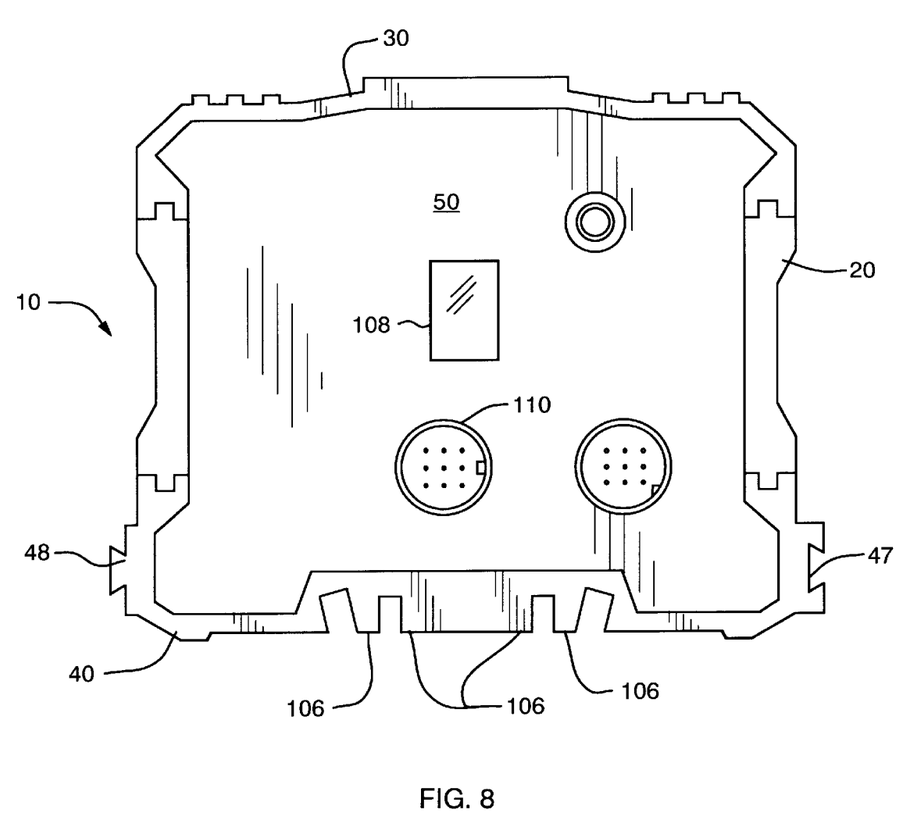
FIG. 8 is an elevational view of an opposite end of the casing.

The casing 10 is especially useful for theatrical and photographic applications. The grooves 43–45 permit the casing 10 to be positioned close to a lighting element on a tripod or stand. When the electronics in the casing 10 are controlled by remote control, only power cables trail from each tripod stand. An IR window 108 on rear end panel 50 in FIG. 8 can serve for remote control use, or one or more cables to connectors 110 may be used.

Further, even when made from extruded aluminum the casing 10 and electronics inside may be sufficiently heavy so that it can double as a counter-weight to balance the elevated weight of a lighting element mounted to the tripod, thus eliminating the need for additional weights.

Another effect of the grooves 43–45, especially when aluminum is used for the casing 10, is to provide additional passive heat dissipation for the electronics inside the casing 10. When the case is engaged onto the stand member 210, 220 or 230, thermal contact between the ribs 106 and stand members 210, 220 or 230 causes the stand to act as a heat sink, as well.

An important feature of the invention is that the casing 10 can be firmly engaged to the stand cross member without connectors and in a simple manner simply by insuring that the cross member is received in its appropriate groove. When double grooves 44,44 are used, the casing is securely balanced between the double cross member 230,230. When a single angled slot or groove 43 or 45 is used, the off-balance position causes the cross member to be firmly pinched in the slot to keep the casing from moving on the cross member despite its being engaged without fasteners.

Figure 9:
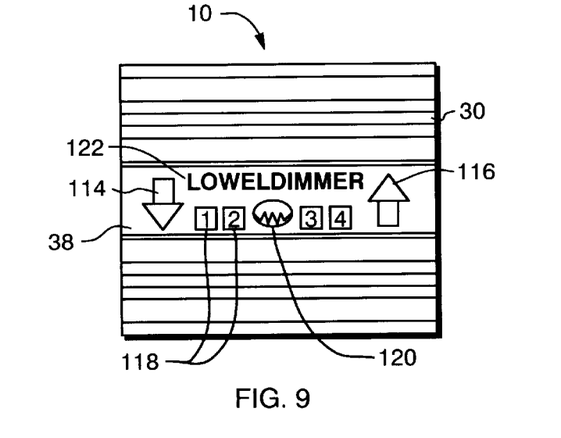
FIG. 9 is a top plan view of the casing.

FIG. 9 illustrates an example of the control panel area 38 which is particularly useful when the electronic board 100 shown in FIG. 1 functions as a manual dimmer. In that case, buttons can be made of different shapes and sizes and placed on the control panel area 38. They can be attached by an appropriate electronic ribbon 112 shown in FIG. 1 to the circuit board 100. In FIG. 9, the left hand down arrow 114 can be pressed to reduce the light intensity while the up arrow 116 can be used to increase intensity. Preset intensities 1, 2, 3 and 4 can be achieved by pressing buttons 118. Another oval button 120 can be pressed to produce a sequential variable speed flickering effect characterized by a graphic on the button 120. Control panel area 38 is also ideal for a company logo 122.

Returning to FIG. 1, among the electronic components in housing 10, an inductor or transformer 130 may be provided which is firmly held within the housing space 60 by a screw 132 extending through the lower panel 40 and into the inductor. This necessary weight, especially when the electronic casing is used as a dimmer, serves the dual purpose of stabilizing the stand or tripod without adding any additional overall weight to the equipment which must be carried around.

Making the channels or screw slots or holes 35 and 41, extend along the respective upper and lower panels 30 and 40, is also expedient for manufacturing cases of any size and to extrude all of the case parts of aluminum or other appropriate material in a continuous and thus inexpensive manner.

While a specific embodiment of the invention has been shown and described in detail to illustrate the application of the principles of the invention, it will be understood that the invention may be embodied otherwise without departing from such principles.

What is claimed is:

1. A casing for electronic components to be held on a stand having a strut, the casing comprising:

at least one panel defining a housing enclosure for an electronic component with a bottom outer surface; and means on the bottom outer surface defining at least one slot in the bottom surface having a depth and width for mounting on the strut of the stand to support the casing on the stand without other means.

2. A casing according to claim 1, further comprising connection means on sides of the casing for connecting a second casing having corresponding connection means.

3. A casing according to claim 2, wherein the connection means comprises complimentary tongue and groove connectors.

4. A casing according to claim 1, wherein said housing enclosure comprises a bottom panel with the bottom outer surface, the bottom outer surface including a plurality of slots extending a full length of the casing, each having a width and depth for engaging onto a strut of a stand, at least one of the slots being at an acute angle to the bottom outer surface and at least one other of the slots being perpendicular to the bottom outer surface.

5. A casing according to claim 4, wherein two of the slots are parallel to each other and are oriented at oblique angles to the bottom surface.

6. A casing according to claim 4, wherein the slots each have a width of between 0.10 inches and 0.30 inches.

7. A casing for electronic components comprising:

a housing forming a chamber for holding electronic components, the housing having a bottom surface and a pair of side surfaces; and at least one groove in the bottom surface having a width sized and capable of use for mounting the housing on one of a strut or a leg of a stand.

8. A casing according to claim 7, wherein the at least one groove comprises a pair of grooves spaced apart and having the same width for mounting the housing over a corresponding spaced apart pair of stand struts.

9. A casing according to claim 7, wherein the at least one groove is oriented at an angle oblique to the bottom surface.

10. A casing according to claim 8, wherein the at least one groove has a width of between 0.10 and 0.30 inches.

11. A casing according to claim 7, further comprising connection means on the sides of the housing for attaching a second housing having corresponding connection means.

12. A casing according to claim 11, wherein the connection means comprises tongue and grooves connectors.

13. A casing according to claim 7, wherein the at least one groove comprises four grooves.

14. A casing according to claim 13, wherein at least two of the grooves are oriented at an angle oblique to the bottom surface.

15. A casing according to claim 7, wherein the casing includes electronic components, the casing with the components having sufficient weight to act as a weight for stabilizing the stand.

* * * * *